(12) United States Patent
Moro et al.

(10) Patent No.: US 7,510,913 B2
(45) Date of Patent: Mar. 31, 2009

(54) METHOD OF MAKING AN ENCAPSULATED PLASMA SENSITIVE DEVICE

(75) Inventors: Lorenza Moro, San Carlos, CA (US); Xi Chu, Freemont, CA (US); Martin Philip Rosenblum, Menlo Park, CA (US); Kenneth Jeffrey Nelson, Sunnyvale, CA (US); Paul E. Burrows, Kennewick, WA (US); Mark E. Gross, Pasco, WA (US); Mac R. Zumhoff, Kennewick, WA (US); Peter M. Martin, Kennewick, WA (US); Charles C. Bonham, Richland, WA (US); Gordon L. Graff, West Richland, WA (US)

(73) Assignee: Vitex Systems, Inc., San Jose, CA (US)

( * ) Notice: Subject to any disclaimer, the term of this patent is extended or adjusted under 35 U.S.C. 154(b) by 205 days.

(21) Appl. No.: 11/439,474

(22) Filed: May 23, 2006

(65) Prior Publication Data

US 2006/0216951 A1  Sep. 28, 2006

Related U.S. Application Data

(63) Continuation-in-part of application No. 11/112,880, filed on Apr. 22, 2005, which is a continuation-in-part of application No. 10/412,133, filed on Apr. 11, 2003.

(51) Int. Cl.
*H01L 21/44* (2006.01)
*H01L 21/48* (2006.01)
*H01L 21/50* (2006.01)
(52) U.S. Cl. ............... 438/124; 438/121; 438/125
(58) Field of Classification Search ............ 438/121, 438/124, 125, 126, 127
See application file for complete search history.

(56) References Cited

U.S. PATENT DOCUMENTS 2,382,432 A    8/1945  McManus et al.

(Continued)

FOREIGN PATENT DOCUMENTS

BE    704297    2/1968

(Continued)

OTHER PUBLICATIONS

Akedo et al., "LP-5: Lake-News Poster: Plasma-CVD SiNx/Plasma-Polymerized CNx:H Multi-layer Passivation Films for Organic Light Emmitting Diods", SID 03 Digest.

(Continued)

*Primary Examiner*—Phuc T Dang
(74) *Attorney, Agent, or Firm*—Dinsmore & Shohl LLP

(57) ABSTRACT

A method of making an encapsulated plasma sensitive device. The method comprises: providing a plasma sensitive device adjacent to a substrate; depositing a plasma protective layer on the plasma sensitive device using a process selected from non-plasma based processes, or modified sputtering processes; and depositing at least one barrier stack adjacent to the plasma protective layer, the at least one barrier stack comprising at least one decoupling layer and at least one barrier layer, the plasma sensitive device being encapsulated between the substrate and the at least one barrier stack, wherein the decoupling layer, the barrier layer, or both are deposited using a plasma process, the encapsulated plasma sensitive device having a reduced amount of damage caused by the plasma compared to an encapsulated plasma sensitive device made without the plasma protective layer. An encapsulated plasma sensitive device is also described.

26 Claims, 8 Drawing Sheets

U.S. PATENT DOCUMENTS

| | | | |
|---|---|---|---|
| 2,384,500 A | 9/1945 | Stoll |
| 3,475,307 A | 10/1969 | Knox et al. |
| 3,607,365 A | 9/1971 | Lindlof |
| 3,941,630 A | 3/1976 | Larrabee |
| 4,061,835 A | 12/1977 | Poppe et al. |
| 4,098,965 A | 7/1978 | Kinsman |
| 4,266,223 A | 5/1981 | Frame |
| 4,283,482 A | 8/1981 | Hattori et al. |
| 4,313,254 A | 2/1982 | Feldman et al. |
| 4,426,275 A | 1/1984 | Meckel et al. |
| 4,521,458 A | 6/1985 | Nelson |
| 4,537,814 A | 8/1985 | Itoh et al. |
| 4,555,274 A | 11/1985 | Kitajima et al. |
| 4,557,978 A | 12/1985 | Mason |
| 4,572,842 A | 2/1986 | Dietrich et al. |
| 4,581,337 A | 4/1986 | Frey et al. |
| 4,624,867 A | 11/1986 | Iijima et al. |
| 4,695,618 A | 9/1987 | Mowrer |
| 4,710,426 A | 12/1987 | Stephens |
| 4,722,515 A | 2/1988 | Ham |
| 4,768,666 A | 9/1988 | Kessler |
| 4,842,893 A | 6/1989 | Yializis et al. |
| 4,843,036 A | 6/1989 | Schmidt et al. |
| 4,855,186 A | 8/1989 | Grolig et al. |
| 4,889,609 A | 12/1989 | Cannella |
| 4,913,090 A | 4/1990 | Harada et al. |
| 4,931,158 A | 6/1990 | Bunshah et al. |
| 4,934,315 A | 6/1990 | Linnebach et al. |
| 4,954,371 A | 9/1990 | Yializis |
| 4,977,013 A | 12/1990 | Ritchie et al. |
| 5,032,461 A | 7/1991 | Shaw et al. |
| 5,036,249 A | 7/1991 | Pike-Biegunski et al. |
| 5,047,131 A | 9/1991 | Wolfe et al. |
| 5,059,861 A | 10/1991 | Littman et al. |
| 5,124,204 A | 6/1992 | Yamashita et al. |
| 5,189,405 A | 2/1993 | Yamashita et al. |
| 5,203,898 A | 4/1993 | Carpenter et al. |
| 5,204,314 A | 4/1993 | Kirlin et al. |
| 5,237,439 A | 8/1993 | Misono et al. |
| 5,260,095 A | 11/1993 | Affinito |
| 5,336,324 A | 8/1994 | Stall et al. |
| 5,354,497 A | 10/1994 | Fukuchi et al. |
| 5,356,947 A | 10/1994 | Ali et al. |
| 5,357,063 A | 10/1994 | House et al. |
| 5,376,467 A | 12/1994 | Takao et al. |
| 5,393,607 A | 2/1995 | Kawasaki et al. |
| 5,395,644 A | 3/1995 | Affinito |
| 5,402,314 A | 3/1995 | Amago et al. |
| 5,427,638 A | 6/1995 | Goetz et al. |
| 5,440,446 A | 8/1995 | Shaw et al. |
| 5,451,449 A | 9/1995 | Shetty et al. |
| 5,461,545 A | 10/1995 | Leroy et al. |
| 5,464,667 A | 11/1995 | Kohler et al. |
| 5,510,173 A | 4/1996 | Pass et al. |
| 5,512,320 A | 4/1996 | Turner et al. |
| 5,536,323 A | 7/1996 | Kirlin et al. |
| 5,547,508 A | 8/1996 | Affinito |
| 5,554,220 A | 9/1996 | Forrest et al. |
| 5,576,101 A | 11/1996 | Saitoh et al. |
| 5,578,141 A | 11/1996 | Mori et al. |
| 5,607,789 A | 3/1997 | Treger et al. |
| 5,620,524 A | 4/1997 | Fan et al. |
| 5,629,389 A | 5/1997 | Roitman et al. |
| 5,652,192 A | 7/1997 | Matson et al. |
| 5,654,084 A | 8/1997 | Egert |
| 5,660,961 A | 8/1997 | Yu |
| 5,665,280 A | 9/1997 | Tropsha |
| 5,681,615 A | 10/1997 | Affinito et al. |
| 5,681,666 A | 10/1997 | Treger et al. |
| 5,684,084 A | 11/1997 | Lewin et al. |
| 5,686,360 A | 11/1997 | Harvey, III et al. |
| 5,693,956 A | 12/1997 | Shi et al. |
| 5,695,564 A | 12/1997 | Imahashi |
| 5,711,816 A | 1/1998 | Kirlin et al. |
| 5,725,909 A | 3/1998 | Shaw et al. |
| 5,731,661 A | 3/1998 | So et al. |
| 5,736,207 A | 4/1998 | Walther et al. |
| 5,747,182 A | 5/1998 | Friend et al. |
| 5,757,126 A | 5/1998 | Harvey, III et al. |
| 5,759,329 A | 6/1998 | Krause et al. |
| 5,771,177 A | 6/1998 | Tada et al. |
| 5,771,562 A | 6/1998 | Harvey, III et al. |
| 5,782,355 A | 7/1998 | Katagiri et al. |
| 5,792,550 A | 8/1998 | Phillips et al. |
| 5,795,399 A | 8/1998 | Hasegawa et al. |
| 5,811,177 A | 9/1998 | Shi et al. |
| 5,811,183 A | 9/1998 | Shaw et al. |
| 5,821,138 A | 10/1998 | Yamazaki et al. |
| 5,821,692 A | 10/1998 | Rogers et al. |
| 5,844,363 A | 12/1998 | Gu et al. |
| 5,869,791 A | 2/1999 | Young |
| 5,872,355 A | 2/1999 | Hueschen |
| 5,891,554 A | 4/1999 | Hosokawa et al. |
| 5,895,228 A | 4/1999 | Biebuyck et al. |
| 5,902,641 A | 5/1999 | Affinito et al. |
| 5,902,688 A | 5/1999 | Antoniadis et al. |
| 5,904,958 A | 5/1999 | Dick et al. |
| 5,912,069 A | 6/1999 | Yializis et al. |
| 5,919,328 A | 7/1999 | Tropsha et al. |
| 5,920,080 A | 7/1999 | Jones |
| 5,922,161 A | 7/1999 | Wu et al. |
| 5,929,562 A | 7/1999 | Pichler |
| 5,934,856 A | 8/1999 | Asakawa et al. |
| 5,945,174 A | 8/1999 | Shaw et al. |
| 5,948,552 A | 9/1999 | Antoniadis et al. |
| 5,952,778 A | 9/1999 | Haskal et al. |
| 5,955,161 A | 9/1999 | Tropsha |
| 5,965,907 A | 10/1999 | Huang et al. |
| 5,968,620 A | 10/1999 | Harvey et al. |
| 5,994,174 A | 11/1999 | Carey et al. |
| 5,996,498 A | 12/1999 | Lewis |
| 6,013,337 A | 1/2000 | Knors |
| 6,040,017 A | 3/2000 | Mikhael et al. |
| 6,045,864 A | 4/2000 | Lyons et al. |
| 6,066,826 A | 5/2000 | Yializis |
| 6,083,313 A | 7/2000 | Venkatraman et al. |
| 6,083,628 A | 7/2000 | Yializis |
| 6,084,702 A | 7/2000 | Byker et al. |
| 6,087,007 A | 7/2000 | Fujii et al. |
| 6,092,269 A | 7/2000 | Yializis et al. |
| 6,106,627 A | 8/2000 | Yializis et al. |
| 6,117,266 A | 9/2000 | Horzel et al. |
| 6,118,218 A | 9/2000 | Yializis et al. |
| 6,137,221 A | 10/2000 | Roitman et al. |
| 6,146,225 A | 11/2000 | Sheates et al. |
| 6,146,462 A | 11/2000 | Yializis et al. |
| 6,150,187 A | 11/2000 | Zyung et al. |
| 6,165,566 A | 12/2000 | Tropsha |
| 6,178,082 B1 | 1/2001 | Farooq et al. |
| 6,195,142 B1 | 2/2001 | Gyotoku et al. |
| 6,198,217 B1 | 3/2001 | Suzuki et al. |
| 6,198,220 B1 | 3/2001 | Jones et al. |
| 6,203,898 B1 | 3/2001 | Kohler et al. |
| 6,207,238 B1 | 3/2001 | Affinito |
| 6,207,239 B1 | 3/2001 | Affinito |
| 6,214,422 B1 | 4/2001 | Yializis |
| 6,217,947 B1 | 4/2001 | Affinito |
| 6,224,948 B1 | 5/2001 | Affinito |
| 6,228,434 B1 | 5/2001 | Affinito |
| 6,228,436 B1 | 5/2001 | Affinito |
| 6,231,939 B1 | 5/2001 | Shaw et al. |
| 6,264,747 B1 | 7/2001 | Shaw et al. |
| 6,268,695 B1 | 7/2001 | Affinito |
| 6,274,204 B1 | 8/2001 | Affinito |

| | | | |
|---|---|---|---|
| 6,322,860 B1 | 11/2001 | Stein et al. | |
| 6,333,065 B1 | 12/2001 | Arai et al. | |
| 6,348,237 B2 | 2/2002 | Kohler et al. | |
| 6,350,034 B1 | 2/2002 | Fleming et al. | |
| 6,352,777 B1 | 3/2002 | Bulovic et al. | |
| 6,358,570 B1 | 3/2002 | Affinito | |
| 6,361,885 B1 | 3/2002 | Chou | |
| 6,387,732 B1 | 5/2002 | Akram | |
| 6,397,776 B1 | 6/2002 | Yang et al. | |
| 6,413,645 B1 | 7/2002 | Graff et al. | |
| 6,416,872 B1 | 7/2002 | Maschwitz | |
| 6,420,003 B2 | 7/2002 | Shaw et al. | |
| 6,436,544 B1 | 8/2002 | Veyrat et al. | |
| 6,460,369 B2 | 10/2002 | Hosokawa | |
| 6,465,953 B1 | 10/2002 | Duggal | |
| 6,468,595 B1 | 10/2002 | Mikhael et al. | |
| 6,469,437 B1 | 10/2002 | Parthasarathy et al. | |
| 6,492,026 B1 | 12/2002 | Graff et al. | |
| 6,497,598 B2 | 12/2002 | Affinito | |
| 6,497,924 B2 | 12/2002 | Affinito et al. | |
| 6,509,065 B2 | 1/2003 | Affinito | |
| 6,512,561 B1 | 1/2003 | Terashita et al. | |
| 6,522,067 B1 | 2/2003 | Graff et al. | |
| 6,537,688 B2 | 3/2003 | Silvernail et al. | |
| 6,544,600 B2 | 4/2003 | Affinito et al. | |
| 6,548,912 B1 | 4/2003 | Graff et al. | |
| 6,569,515 B2 | 5/2003 | Hebrink et al. | |
| 6,570,325 B2 | 5/2003 | Graff et al. | |
| 6,573,652 B1 | 6/2003 | Graff et al. | |
| 6,576,351 B2 | 6/2003 | Silvernail | |
| 6,592,969 B1 | 7/2003 | Burroughes et al. | |
| 6,597,111 B2 | 7/2003 | Silvernail et al. | |
| 6,613,395 B2 | 9/2003 | Affinito et al. | |
| 6,614,057 B2 | 9/2003 | Silvernail et al. | |
| 6,624,568 B2 | 9/2003 | Silvernail | |
| 6,627,267 B2 | 9/2003 | Affinito | |
| 6,628,071 B1 | 9/2003 | Su | |
| 6,653,780 B2 | 11/2003 | Sugimoto et al. | |
| 6,656,537 B2 | 12/2003 | Affinito et al. | |
| 6,660,409 B1 * | 12/2003 | Komatsu et al. | 428/690 |
| 6,664,137 B2 | 12/2003 | Weaver | |
| 6,681,716 B2 | 1/2004 | Schaepkens | |
| 6,720,203 B2 | 4/2004 | Carcia et al. | |
| 6,734,625 B2 | 5/2004 | Vong et al. | |
| 6,737,753 B2 | 5/2004 | Kumar et al. | |
| 6,743,524 B2 | 6/2004 | Schaepkens | |
| 6,749,940 B1 | 6/2004 | Terasaki et al. | |
| 6,765,351 B2 | 7/2004 | Forrest et al. | |
| 6,803,245 B2 | 10/2004 | Auch et al. | |
| 6,811,829 B2 | 11/2004 | Affinito et al. | |
| 6,815,887 B2 | 11/2004 | Lee et al. | |
| 6,818,291 B2 | 11/2004 | Funkenbusch et al. | |
| 6,835,950 B2 | 12/2004 | Brown et al. | |
| 6,836,070 B2 | 12/2004 | Chung et al. | |
| 6,837,950 B1 | 1/2005 | Berard | |
| 6,864,629 B2 | 3/2005 | Miyaguchi et al. | |
| 6,866,901 B2 * | 3/2005 | Burrows et al. | 428/1.5 |
| 6,867,539 B1 | 3/2005 | McCormick et al. | |
| 6,872,114 B2 | 3/2005 | Chung et al. | |
| 6,872,248 B2 | 3/2005 | Mizutani et al. | |
| 6,872,428 B2 | 3/2005 | Yang et al. | |
| 6,878,467 B2 | 4/2005 | Chung et al. | |
| 6,888,305 B2 | 5/2005 | Weaver | |
| 6,888,307 B2 | 5/2005 | Silvernail et al. | |
| 6,891,330 B2 | 5/2005 | Duggal et al. | |
| 6,897,474 B2 | 5/2005 | Brown et al. | |
| 6,897,607 B2 | 5/2005 | Sugimoto et al. | |
| 6,905,769 B2 | 6/2005 | Komada | |
| 6,923,702 B2 | 8/2005 | Graff et al. | |
| 6,936,131 B2 | 8/2005 | McCormick et al. | |
| 6,975,067 B2 | 12/2005 | McCormick et al. | |
| 6,994,933 B1 | 2/2006 | Bates | |
| 6,998,648 B2 | 2/2006 | Silvernail | |
| 7,002,294 B2 | 2/2006 | Forrest et al. | |
| 7,012,363 B2 | 3/2006 | Weaver et al. | |
| 7,015,640 B2 | 3/2006 | Schaepkens et al. | |
| 7,018,713 B2 | 3/2006 | Padiyath et al. | |
| 7,029,765 B2 | 4/2006 | Kwong et al. | |
| 7,033,850 B2 | 4/2006 | Tyan et al. | |
| 7,056,584 B2 | 6/2006 | Iacovangelo | |
| 7,086,918 B2 | 8/2006 | Hsiao et al. | |
| 7,112,351 B2 | 9/2006 | Affinito | |
| 7,156,942 B2 | 1/2007 | McCormick et al. | |
| 7,166,007 B2 | 1/2007 | Auch et al. | |
| 7,183,197 B2 | 2/2007 | Won et al. | |
| 7,186,465 B2 | 3/2007 | Bright | |
| 7,198,832 B2 | 4/2007 | Burrows et al. | |
| 7,221,093 B2 | 5/2007 | Auch et al. | |
| 7,255,823 B1 | 8/2007 | Guenther et al. | |
| 2001/0015074 A1 | 8/2001 | Hosokawa | |
| 2001/0015620 A1 | 8/2001 | Affinito | |
| 2002/0022156 A1 | 2/2002 | Bright | |
| 2002/0025444 A1 | 2/2002 | Hebgrink et al. | |
| 2002/0068143 A1 | 6/2002 | Silvernail | |
| 2002/0069826 A1 | 6/2002 | Hunt et al. | |
| 2002/0102363 A1 | 8/2002 | Affinito et al. | |
| 2002/0102818 A1 | 8/2002 | Sandhu et al. | |
| 2002/0125822 A1 | 9/2002 | Graff et al. | |
| 2002/0139303 A1 | 10/2002 | Yamazaki et al. | |
| 2002/0140347 A1 | 10/2002 | Weaver | |
| 2003/0038590 A1 | 2/2003 | Silvernail et al. | |
| 2003/0045021 A1 * | 3/2003 | Akai | 438/99 |
| 2003/0085652 A1 | 5/2003 | Weaver | |
| 2003/0098647 A1 | 5/2003 | Silvernail et al. | |
| 2003/0117068 A1 | 6/2003 | Forrest et al. | |
| 2003/0124392 A1 | 7/2003 | Bright | |
| 2003/0127973 A1 | 7/2003 | Weaver et al. | |
| 2003/0134487 A1 | 7/2003 | Breen et al. | |
| 2003/0184222 A1 | 10/2003 | Nilsson et al. | |
| 2003/0197197 A1 | 10/2003 | Brown et al. | |
| 2003/0218422 A1 | 11/2003 | Park et al. | |
| 2003/0235648 A1 | 12/2003 | Affinito et al. | |
| 2004/0018305 A1 | 1/2004 | Pagano et al. | |
| 2004/0029334 A1 | 2/2004 | Bijker et al. | |
| 2004/0046497 A1 | 3/2004 | Schaepkens et al. | |
| 2004/0071971 A1 | 4/2004 | Locovangelo | |
| 2004/0113542 A1 | 6/2004 | Hsiao et al. | |
| 2004/0115402 A1 | 6/2004 | Schaepkens | |
| 2004/0115859 A1 | 6/2004 | Murayama et al. | |
| 2004/0119028 A1 | 6/2004 | McCormick et al. | |
| 2004/0175512 A1 | 9/2004 | Schaepkens | |
| 2004/0175580 A1 | 9/2004 | Schaepkens | |
| 2004/0209090 A1 | 10/2004 | Iwanaga | |
| 2004/0219380 A1 | 11/2004 | Naruse et al. | |
| 2004/0229051 A1 | 11/2004 | Schaepkens et al. | |
| 2004/0241454 A1 | 12/2004 | Shaw et al. | |
| 2004/0263038 A1 | 12/2004 | Ribolzi et al. | |
| 2005/0003098 A1 | 1/2005 | Kohler et al. | |
| 2005/0006786 A1 | 1/2005 | Sawada | |
| 2005/0051094 A1 | 3/2005 | Schaepkens et al. | |
| 2005/0079295 A1 | 4/2005 | Schaepkens | |
| 2005/0079380 A1 | 4/2005 | Iwanaga | |
| 2005/0093001 A1 | 5/2005 | Liu et al. | |
| 2005/0093437 A1 | 5/2005 | Ouyang | |
| 2005/0094394 A1 | 5/2005 | Padiyath et al. | |
| 2005/0095422 A1 | 5/2005 | Sager et al. | |
| 2005/0095736 A1 | 5/2005 | Padiyath et al. | |
| 2005/0112378 A1 | 5/2005 | Naruse et al. | |
| 2005/0122039 A1 | 6/2005 | Satani | |
| 2005/0129841 A1 | 6/2005 | McCormick et al. | |
| 2005/0133781 A1 | 6/2005 | Yan et al. | |
| 2005/0140291 A1 | 6/2005 | Hirakata et al. | |
| 2005/0146267 A1 | 7/2005 | Lee et al. | |
| 2005/0174045 A1 | 8/2005 | Lee et al. | |
| 2005/0176181 A1 | 8/2005 | Burrows et al. | |
| 2005/0202646 A1 | 9/2005 | Burrows et al. | |

| | | | |
|---|---|---|---|
| 2005/0212419 A1 | 9/2005 | Vazan et al. | |
| 2005/0238846 A1 | 10/2005 | Arakatsu et al. | |
| 2005/0239294 A1 | 10/2005 | Rosenblum et al. | |
| 2006/0001040 A1 | 1/2006 | Kim et al. | |
| 2006/0003474 A1 | 1/2006 | Tyan et al. | |
| 2006/0028128 A1 | 2/2006 | Ohkubo | |
| 2006/0061272 A1 | 3/2006 | McCormick et al. | |
| 2006/0062937 A1 | 3/2006 | Padiyath et al. | |
| 2006/0063015 A1 | 3/2006 | McCormick et al. | |
| 2006/0132461 A1 | 6/2006 | Furukawa et al. | |
| 2006/0246811 A1 | 11/2006 | Winters et al. | |
| 2006/0250084 A1 | 11/2006 | Cok et al. | |
| 2007/0009674 A1 | 1/2007 | Okubo et al. | |
| 2007/0281089 A1 | 12/2007 | Heller et al. | |

FOREIGN PATENT DOCUMENTS

| | | | |
|---|---|---|---|
| BG | 704 297 | 2/1968 | |
| CA | 2 353 506 | 5/2000 | |
| DE | 196 03 746 A1 | 4/1997 | |
| DE | 696 15 510 T2 | 6/1997 | |
| EP | 0 147 696 B1 | 7/1985 | |
| EP | 0 299 753 A2 | 1/1989 | |
| EP | 0 340 935 A2 | 11/1989 | |
| EP | 0 390 540 B1 | 10/1990 | |
| EP | 0 468 440 A2 | 1/1992 | |
| EP | 0 547 550 A1 | 6/1993 | |
| EP | 0 590 467 A1 | 4/1994 | |
| EP | 0 722 787 A2 | 7/1996 | |
| EP | 0 777 280 A2 | 6/1997 | |
| EP | 0 777 281 A2 | 6/1997 | |
| EP | 0 787 824 A2 | 6/1997 | |
| EP | 0 787 826 A1 | 6/1997 | |
| EP | 0 915 105 A1 | 5/1998 | |
| EP | 0 916 394 A2 | 5/1998 | |
| EP | 0 931 850 A1 | 7/1999 | |
| EP | 0 977 469 A2 | 2/2000 | |
| EP | 1 021 070 A1 | 7/2000 | |
| EP | 1 127 381 | 8/2001 | |
| EP | 1 130 420 A2 | 9/2001 | |
| EP | 1 278 244 A2 | 1/2003 | |
| EP | 1 426 813 A2 | 6/2004 | |
| EP | 1514317 A1 | 3/2005 | |
| GB | 2 210 826 A | 6/1989 | |
| JP | S63-96895 | 4/1988 | |
| JP | 63136316 | 8/1988 | |
| JP | 6418441 | 1/1989 | |
| JP | 1041067 | 2/1989 | |
| JP | 01041067 | 2/1989 | |
| JP | S64-41192 | 2/1989 | |
| JP | 02183230 | 7/1990 | |
| JP | 3-183759 | 8/1991 | |
| JP | 03290375 | 12/1991 | |
| JP | 4-14440 | 1/1992 | |
| JP | 4-48515 | 2/1992 | |
| JP | 04267097 | 9/1992 | |
| JP | 06158305 | 11/1992 | |
| JP | 05-217158 | 1/1993 | |
| JP | 5-147678 | 6/1993 | |
| JP | 05182759 | 7/1993 | |
| JP | 06-136159 | 5/1994 | |
| JP | 61-79644 | 6/1994 | |
| JP | 06234186 A | 8/1994 | |
| JP | 07-074378 | 3/1995 | |
| JP | 7147189 | 6/1995 | |
| JP | 07147189 | 6/1995 | |
| JP | 07192866 | 7/1995 | |
| JP | 8-72188 | 3/1996 | |
| JP | 08171988 | 7/1996 | |
| JP | 08179292 | 7/1996 | |
| JP | 08325713 | 10/1996 | |
| JP | 8-318590 | 12/1996 | |
| JP | 09059763 | 4/1997 | |
| JP | 09132774 | 5/1997 | |
| JP | 9-161967 | 6/1997 | |
| JP | 09161967 | 6/1997 | |
| JP | 9-201897 | 8/1997 | |
| JP | 09-232553 | 9/1997 | |
| JP | 10-725 | 1/1998 | |
| JP | 10-013083 | 1/1998 | |
| JP | 10-016150 | 1/1998 | |
| JP | 10312883 | 11/1998 | |
| JP | 10-334744 | 12/1998 | |
| JP | 11-017106 | 1/1999 | |
| JP | 11040344 | 2/1999 | |
| JP | 11-149826 | 6/1999 | |
| JP | 11255923 | 9/1999 | |
| JP | 2000058258 | 2/2000 | |
| JP | 2002/505 969 | 2/2002 | |
| JP | 2002/505969 | 2/2002 | |
| JP | 2006-294780 | 10/2006 | |
| WO | WO 87/07848 | 12/1987 | |
| WO | WO 89/00337 | 1/1989 | |
| WO | WO 95/10117 | 4/1995 | |
| WO | WO 96/23217 | 8/1996 | |
| WO | WO 97/04885 | 2/1997 | |
| WO | WO 97/16053 | 5/1997 | |
| WO | WO 97/22631 | 6/1997 | |
| WO | WO 98/10116 | 3/1998 | |
| WO | WO 98/18852 | 5/1998 | |
| WO | WO 99/16557 | 4/1999 | |
| WO | WO 99/16931 | 4/1999 | |
| WO | WO 99/46120 | 9/1999 | |
| WO | WO 00/26973 | 5/2000 | |
| WO | WO 00/35603 | 6/2000 | |
| WO | WO 00/35604 | 6/2000 | |
| WO | WO 00/35993 | 6/2000 | |
| WO | WO 00/36661 | 6/2000 | |
| WO | WO 00/36665 | 6/2000 | |
| WO | 00/53423 A1 | 9/2000 | |
| WO | WO 01/68360 | 9/2001 | |
| WO | WO 01/81649 A1 | 11/2001 | |
| WO | WO 01/82336 A2 | 11/2001 | |
| WO | WO 01/82389 A1 | 11/2001 | |
| WO | WO 01/87825 A1 | 11/2001 | |
| WO | WO 01/89006 A1 | 11/2001 | |
| WO | WO 02/26973 | 4/2002 | |
| WO | WO 03/016589 A1 | 2/2003 | |
| WO | WO 03/098716 A1 | 11/2003 | |
| WO | WO 03/098716 A1 | 11/2003 | |
| WO | WO 2004/006199 A3 | 1/2004 | |
| WO | WO 2004/016992 A1 | 2/2004 | |
| WO | WO 2004/070840 A1 | 8/2004 | |
| WO | WO 2004/089620 A2 | 10/2004 | |
| WO | 2004/112165 A1 | 12/2004 | |
| WO | WO 2005/015655 A1 | 2/2005 | |
| WO | WO 2005/045947 A2 | 5/2005 | |
| WO | WO 2005/048368 A1 | 5/2005 | |
| WO | 2005050754 A1 | 6/2005 | |
| WO | WO 2006/036492 A1 | 4/2006 | |

OTHER PUBLICATIONS

Chwang et al., "Thin Film encapsulated flexible organic electroluminescent displays", American Institute of Physics, 2003.

Clark I. Bright, et al., Transparent Barrier Coatings Based on ITO for Flexible Plastic Displays, Oct. 17-19, 1999, pp. 247-264, Tucson, Arizona.

Affinito, J.D. et al.; Vacuum Deposited Polymer/metal Multilayer Films for Optical Applications; Paper No. C1.13; pp. 1-14.

Shi, M.K. et al.; Plasma treatment of PET and acrylic coating surfaces-I. In situ XPS measurements; Journal of Adhesion Science and Technology; Mar. 14, 2000(12); pp. 1-8.

Affinito, J.D. et al.; Vacuum Deposition of Polymer Electrolytes on Flexible Substrates, The Ninth International Conference on Vacuum Web Caoting; pp. 20-37.

Affinito, J.D. et al; Ultrahigh Rate, Wide Area, Plaza Polymerized Films from High Molecular Weight/Low Vapor Pressure Liquid or Solid Monomer Precursors; Journal Vacuum Science Technology A 17(4); Jul./Aug. 1999; pp. 1974-1982; American Vacuum Society.

Shi, M.K. et al.; In situ and real-time monitoring of plasma-induced etching PET and acrylic films; Dec. 1999, 494; pp. 1-25.

Affinito, J.D. et al.; Vacuum Deposited Conductive Polymer Films; The Eleventh International Conference on Vacuum Web Coating; pp. 0-12.

Affinito, J.D. et al; Molecularly Doped Polymer Composite Films for Light Emitting Polymer Application Fabricated by the PML Process; 41st Technical Conference of the Society of Vacuum Coaters; 1998; pp. 220-225.

Affinito, J.D. et al; Polymer/polymer, Polymer/Oxide, and Polymer/Metal Vacuum Deposited Interferences Filters; Tenth International Vacuum Web Coating Conference; pp. 0-14.

Affinito, J.D. et al.; Vacuum Deposited Polymer/Metal Multilayer Films for Optical Application; Thin Solid Films 270, 1995; pp. 43-48.

Felts, J.T.; Transparent Barrier Coatings Update: Flexible Substrates; pp. 324-331.

Graupner, W. et al; "High Resolution Color Organic Light Emitting Diode Microdisplay Febrication Method", SPIE Proceedings; Nov. 6, 2000; pp. 11-19.

Czeremuszkin, G. et al; Permeation Through Defects in Transparent Barrier Coated Plastic Films; 43rd Annual Technical Conference Proceedings; Apr. 15, 2000; pp. 408-413.

Vossen, J.L. et al.; Thin Film Processes; Academic Press, 1978, Part II, Chapter II-1, Glow Discharge Sputter Deposition, pp. 12-63; Part IV, Chapter IV-1 Plasma Deposition of Inorganic Compounds and Chapter IV-2 Glow Discharge Polymerization, pp. 335-397.

Affinito, J.D. et al.; Ultra High Rate, Wide Area, Plasma Polymerized Films from High Molecular Weight/Low Vapor Pressure Liquid or Solid Monomer Precursors; 45th International Symposium of the American Vacuum Society; pp. 0-26.

G. Gustafason, et al.; Flexible light-emitting diodes made from soluble conducting polymers; Letters to Nature; Vo. 357; Jun. 11, 1992; pp. 477-479.

Tropsha et al.; Combinatorial Barrier Effect to the Multilayer SiOx Coatings on Polymer Substrates; 1997 Society of Vacuum Coaters, 40th Annual Technical Conferences Proceedings; pp. 64-69.

Tropsha et al.; Activated Rate Theory Treatment of Oxygen and Water Transport through Silicon Oxide/Poly (ethylene terphthalate) Composite Barrier Structures; J. Phys. Chem B1997 pp. 2259-2266.

F.M. Penning; Electrical Discharges in Gases; 1965; pp. 1-51; Gordon and Breach, Science Publishers, New York-London-Paris.

Affinito, J.D., et al; High Rate Vacuum Deposition of Polymer Electrolytes; Journal Vacuum Science Technology A 14(3), May/Jun. 1996.

Mahon, J.K., et al; Requirements of Flexible Substrates for Organic Light Emitting Devices in Flat Panel Display Applications, Society of Vacuum Coaters, 42nd Annual Technical Conference Proceedings, 1999, pp. 456-459.

Henry, B.M. et al.; Microstructural and Gas Barrier Properties of Transparent Aluminium Oxide and Indium Tin Oxide Films; 2000; pp. 373-378; Society of Vacuum Coaters.

Phillips, R.W.; Evaporated Dielectric Colorless Films on PET and OPP Exhibiting High Barriers Toward Moisture and Oxygen; Society of Vacuum Coaters; 36th Annual Technical Conference Proceedings; 1993; pp. 293-301.

Yamada Y. et al.; The Properties of a New Transparent and Colorless Barrier Film; 1995; pp. 28-31; Society of Vacuum Coaters.

Chahroudi, D.; Transparent Glass Barrier Coatings for Flexible Film Packaging; 1991; pp. 130-133; Society of Vacuum Coaters.

Bright, Clark, I.; Transparent Barrier Coatings Based on ITO for Flexible Plastic Displays; pp. 247-255.

Henry, B.M. et al.; Microstructural Studies of Transparent Gas Barrier Coatings on Polymer Substrates; pp. 265-273.

Hibino, N. et al.; Transparent Barrier A12 03 Coating By Activated Reactive Evaporation; pp. 234-245.

Kukla, R. et al.; Transparent Barrier Coatings with EB-Evaporation, an Update; Section Five; Transparent Barrier Coating Papers; pp. 222-233.

Krug, T. et al.; New Developments in Transparent Barrier Coatings; 1993; pp. 302-305; Society Vacuum Coaters.

Affinito, J.D. et al.; PML/Oxide/PML Barrier Layer Performance Differences Arising from use of UV or Electron Beam Polymerization of the PML Layers; Thin Solid Films; Elsevier Science S.A.; vol. 308-309; Oct. 31, 1997; pp. 19-25.

Affinito, J.D. et al.; A new method for fabricating transparent barrier layers, Thin Solid Films 290-291; 1996; pp. 63-67.

Affinito, J.D. et al.; Polymer-Oxide Transparent Barrier Layers; SVC 39th Annual Technical Conference; Vacuum Web Coating Session; 1996; pp. 392-397.

Hoffman, G. et al.; Transparent Barrier Coatings by Reactive Evaporation; 1994; pp. 155-160; Society of Vacuum Coaters.

Norenberg, H. et al.; Comparative Study of Oxygen Permeation Through Polymers and Gass Barrier Films; 2000; pp. 347-351; Society of Vacuum Coaters.

Yializis, A. et al.; Ultra High Barrier Films; 2000; pp. 404-407; Society Vacuum Coaters.

Kelmberg-Sapieha, J.E. et al.; Transparent Gas Barrier Coatings Produced by Dual-Frequency PECVD; 1993; pp. 445-449; Society of Vacuum Coaters.

Finson, E. et al.; Transparent SiO2 Barrier Coatings: Conversion of Production Status; 1994; pp. 139-143; Society of Vacuum Coaters.

Yializis, A. et al.; High Oxygen Barrier Polypropylene Films Using Transparent Acrylate-A203 and Opaque AI-Acrylate Coatings; 1995; pp. 95-102; Society of Vacuum Coaters.

Shaw, D.G. et al.; Use of Vapor Deposted Acrylate Coatings to Improve the Barrier Properties of Metalized Film; 1994; pp. 240-244; Society of Vacuum Coaters.

Affinito, J.D. et al.; "Vacuum Deposited Conductive Polymer Films" The Eleventh International Conference on Vacuum Web Coating, no earlier than Feb. 1998, pp. 200-213.

Affinito, J.D. et al.; "Molecularly Doped Polymer Composite Films for Light Emitting Polymer Applications Fabricated by the PML Process" 41st Technical Conference of Society of Vacuum Coaters, Apr. 1998, pp. 1-6.

Affinito, J.D. et al.; "Vacuum Deposition of Polymer Electrolytes on Flexible Substrates" The Ninth International Conference on Vacuum Web Coating, pp. 0-16.

Bunshah, R.F. et al.; "Deposition Technologies for Films and Coatings" Noyes Publications, Park Ridge, New Jersey, 1982, p. 339.

Affinito, J.D.; Energy Res. Abstr. 18(6), #17171, 1993.

Atsuhisa Inoue, Maariko Ishino, Yoshiro Akagi and Yoshiharu Nakajima, Fabrication of a Thin Film of MNA by Vapour Deposition, Proc. of the 33rd Japan Conf. on Materials Research, U.33, p. 177-179, 1990.

Moro et al "Process and design of a multilayer thin film encapsulation of passive matrix OLED displays" Proceedings of the SPIE, The International Society for Optical Engineering SPIE-Int. Opt. Eng. USA, vol. 5214, No. 1, 2004, pp. 83-93.

Han-Ki Kim et al "Magnetic Field Shape Effect on Electrical Properties of TOLEDs in the Deposition of ITO Top Cathode Layer" Electrochemical and Solid-State Letters, Electrochemical Society USA, vol. 8, No. 12, Dec. 2005, pp. H103-H105.

De Gryse, R. et al., "Sputtered Transparent Barrier Layers," Tenth International Conference on Vacuum Web Coating, Nov. 1996, pp. 190-198.

Wong, C.P.; Recent Advances in IC Passivation and Encapsulation: Process Techniques and Materials; Polymers for Electronic and Photonic Applications; AT&T bell Laboratories; 1993; pp. 167-209.

Shi, M.K., et al., In situ and real-time monitoring of plasma-induced etching PET and acrylic films, Plasma and Polymers, Dec. 1999, 4(4), pp. 1-25.

Affinito, J.D. et al.; Vacuum Deposited Polymer/metal Multilayer Films for Optical Applications; Paper No. C1.13; International Confernce on Metallurgical Coatings; Apr. 15-21, 1995; pp. 1-14.

Affinito, J.D. et al., "Vacuum Deposition Of Polymer Electrolytes On Flexible Substrates" Proceedings of the Ninth International Conference on Vacuum Web Coating, Nov. 1995, ed R. Bakish, Bakish Press 1995, pp. 20-36.

PCT International Search Report regarding International application No. PCT/US 99/29853 dated Mar. 3, 2000.

Yializis A., et al., "Ultra High Barrier Films" 43rd Annual Technical Conference Proceedings, Denver, Apr. 15-20, 2000, pp. 404-407.

Henry, B.M. et al., "Microstructural ang Gas Barrier Properties of Transparent Aluminum Oxide and Indium Tin Oxide Films" 43rd Annual Technical Conference Proceedings, Denver, Apr. 15-20, 2000, pp. 373-378.

Affinito, J.D. et al.; Vacuum Deposition of Polymer Electrolytes on Flexible Substrates; The Ninth International Conference on Vacuum Web Coating; 1995; pp. 0-16.

Norenberg, H. et al.; Comparative Study of Oxygen Permeation Through Polymers and Gas Barrier Films; 43rd Annual Technical Conference Proceedings; Denver, Apr. 15-20, 2000; pp. 347-351.

Mahon, J.K. et al., Requirements of Flexible Substrates for Organic Light Emitting Devices in Flat Panel Display Applications; Society of Vacuum Coaters; 42nd Annual Technical Conference Proceedings; Apr. 1999; pp. 456-459.

Tropsha; Activated Rate Theory Treatment of Oxygen and Water Transport through Silicon Oxide/Poly(ethylene terphthalate) Composite Barrier Structures; J. Phys. Chem B Mar. 1997; pp. 2259-2266.

Tropsha et al.; Combinatorial Barrier Effect of the Multilayer SiOx Coatings on Polymer Substrates; Society of Vacuum Coaters; 40th Annual Technical Conferences Proceedings; Apr. 12-17, 1997; pp. 64-69.

Affinito, J.D. et al.; Ultra High Rate, Wide Area, Plasma Polymerized Films from High Molecular Weight/Low Vapor Pressure Liquid or Solid Monomer Precursors; 45th International Symposium of the American Vacuum Society; Nov. 2-6, 1998; pp. 0-26.

Felts, J.T.; Transparent Barrier Coatings Update: Flexible Substrates; 36th Annual Technical Conference Proceedings; Apr. 25-30, 1993 pp. 324-331.

Affinito, J.D. et al.; Molecularly Doped Polymer Composite Films for Light Emitting Polymer Application Fabricated by the PML Process, 41st Technical Conference of the Society of Vacuum Coaters; Apr. 1998; pp. 220-225.

Affinito, J.D. et al.; Vacuum Deposited Conductive Polymer Films; The Eleventh International Conference on Vacuum Web Coating; Nov. 9-11, 1997; pp. 0-12.

Affinito, J.D. et al.; Polymer/Polymer, Polymer/Oxide, and Polymer/Metal Vacuum Deposited Interferences Filters; Tenth International Vacuum Web Coating Conference; Nov. 1996; pp. 0-14.

Kukla, R. et al.; Transparent Barrier Coatings with EB-Evaporation, an Update; Section Five; Transparent Barrier Coating Papers; Thirteenth International Conference on Vacuum Web Coatings; Oct. 17-19, 1999; pp. 222-233.

Bright, Clark I.; Transparent Barrier Coatings Based on ITO for Flexible Plastic Displays; Thirteenth International Conference on Vacuum Web Coatings; Oct. 17-19, 1999; pp. 247-255.

Henry, B.M. et al.; Microstructural Studies of Transparent Gas Barrier Coatings on Polymer Substrates; Thirteenth International Conference on Vacuum Web Coatings; Oct. 17-19, 1999; pp. 265-273.

Hibino, N. et al.; Transparent Barrier $Al_2O_3$ Coating By Activated Reactive Evaporation; Thirteenth International Conference on Vacuum Web Coatings; Oct. 17-19, 1999; pp. 234-245.

Shi, M.K. et al.; Plasma treatment of PET and acrylic coating surfaces-I. In situ XPS measurements; Journal of Adhesion Science and Technology; Mar. 2000, 14(12); pp. 1-28.

Affinito, J.D. et al.; "PML/Oxide/PML Barrier Layer Performance Differences Arising From Use of UV or Electron Beam Polymerization of the PML Layers;" SVC 40th Annual Technical Conference; Apr. 12-17, 1997; pp. 19-25.

Affinito, J.D. et al.; Ultra High Rate, Wide Area, Plasma Polymerized Films from High Molecular Weight/Low Vapor Pressure Liquid or Liquid/Solid Suspension Monomer Precursors; MRS Conference; Nov. 29-Dec. 3, 1998; Paper No. Y12.1.

Wong, F.L., et al., "Long-lifetime thin-film encapsulated organic light-emitting diodes," Journal of Applied Physics 104, pp. 014509-1-4 (2008).

* cited by examiner

METHOD OF MAKING AN ENCAPSULATED PLASMA SENSITIVE DEVICE

CROSS REFERENCE TO RELATED APPLICATIONS

This application is a continuation-in-part of application Ser. No. 11/112880, filed Apr. 22, 2005, entitled Apparatus for Depositing a Multilayer Coating on Discrete Sheets, which is a continuation-in-part of application Ser. No. 10/412133, filed Apr. 11, 2003, entitled Apparatus for Depositing a Multilayer Coating on Discrete Sheets.

BACKGROUND OF THE INVENTION

The present invention relates generally to encapsulated devices, and more particularly to encapsulated plasma sensitive devices, and to methods of making encapsulated plasma sensitive devices.

Many devices are subject to degradation caused by permeation of environmental gases or liquids, such as oxygen and water vapor in the atmosphere or chemicals used in the processing of the electronic product. The devices are usually encapsulated in order to prevent degradation.

Various types of encapsulated devices are known. For example, U.S. Pat. No. 6,268,695, entitled "Environmental Barrier Material For Organic Light Emitting Device And Method Of Making," issued Jul. 31, 2001; U.S. Pat. No. 6,522,067, entitled "Environmental Barrier Material For Organic Light Emitting Device And Method Of Making," issued Feb. 18, 2003; and U.S. Pat. No. 6,570,325, entitled "Environmental Barrier Material For Organic Light Emitting Device And Method Of Making", issued May 27, 2003, all of which are incorporated herein by reference, describe encapsulated organic light emitting devices (OLEDs). U.S. Pat. No. 6,573,652, entitled "Encapsulated Display Devices", issued Jun. 3, 2003, which is incorporated herein by reference, describes encapsulated liquid crystal displays (LCDs), light emitting diodes (LEDs), light emitting polymers (LEPs), electronic signage using electrophoretic inks, electroluminescent devices (EDs), and phosphorescent devices. U.S. Pat. No. 6,548,912, entitled "Semiconductor Passivation Using Barrier Coatings," issued Apr. 15, 2003, which is incorporated herein by reference, describes encapsulated microelectronic devices, including integrated circuits, charge coupled devices, light emitting diodes, light emitting polymers, organic light emitting devices, metal sensor pads, micro-disk lasers, electrochromic devices, photochromic devices, microelectromechanical systems, and solar cells.

Generally, encapsulated devices can be made by depositing barrier stacks adjacent to one or both sides of the device. The barrier stacks typically include at least one barrier layer and at least one decoupling layer. There could be one decoupling layer and one barrier layer, there could be multiple decoupling layers on one side of one or more barrier layers, or there could be one or more decoupling layers on both sides of one or more barrier layers. The important feature is that the barrier stack has at least one decoupling layer and at least one barrier layer.

One embodiment of an encapsulated display device is shown in FIG. 1. The encapsulated display device 100 includes a substrate 105, a display device 110, and a barrier stack 115. The barrier stack 115 includes a barrier layer 120 and a decoupling layer 125. The barrier stack 115 encapsulates the display device 110, preventing environmental oxygen and water vapor from degrading the display device.

The barrier layers and decoupling layers in the barrier stack can be made of the same material or of a different material. The barrier layers are typically about 100-400 Å thick, and the decoupling layers are typically about 1000-10,000 Å thick.

Although only one barrier stack is shown in FIG. 1, the number of barrier stacks is not limited. The number of barrier stacks needed depends on the level of water vapor and oxygen permeation resistance needed for the particular application. One or two barrier stacks should provide sufficient barrier properties for some applications. The most stringent applications may require five or more barrier stacks.

The barrier layers can be deposited using a vacuum process, such as sputtering, chemical vapor deposition (CVD), metalorganic chemical vapor deposition (MOCVD), plasma enhanced chemical vapor deposition (PECVD), evaporation, sublimation, electron cyclotron resonance-plasma enhanced vapor deposition (ECR-PECVD), and combinations thereof. Suitable barrier materials include, but are not limited to, metals, metal oxides, metal nitrides, metal carbides, metal oxynitrides, metal oxyborides, and combinations thereof.

The decoupling layers can be deposited using a vacuum process, such as flash evaporation with in situ polymerization under vacuum, or plasma deposition and polymerization, or atmospheric processes, such as spin coating, ink jet printing, screen printing, or spraying. Suitable materials for the decoupling layer include, but are not limited to, organic polymers, inorganic polymers, organometallic polymers, hybrid organic/inorganic polymer systems, and silicates.

As an example, an OLED can be encapsulated with a barrier stack including one or more polymeric decoupling layers and one or more barrier layers. The polymeric decoupling layers can be formed from acrylate functional precursors which are deposited using flash evaporation and polymerized by ultraviolet (UV) exposure. The barrier layers can be reactively sputtered aluminum oxide.

Depositing multi-layer barrier stacks on relatively insensitive substrates such polymer films does not typically result in damage to the substrate. In fact, several patents disclose the use of plasma treatment to improve properties for a multi-layer barrier on a substrate. U.S. Pat. No. 6,083,628 discloses plasma treatment of polymeric film substrates and polymeric layers from acrylates deposited using a flash evaporation process as a means of improving properties. U.S. Pat. No. 5,440,466 similarly discusses plasma treatment of substrates and acrylate layers to improve properties.

However, we have found that some of the devices being encapsulated have been damaged by the plasma used in depositing the barrier and/or decoupling layers. Plasma damage has occurred when a substrate with a plasma sensitive device on it, such as an OLED, is encapsulated with a multi-layer barrier stack in which a plasma based and/or assisted process is used to deposit a barrier layer or decoupling layer. For example, plasma damage has occurred when reactively sputtering a barrier layer of $AlO_x$ under conditions suitable for achieving barrier properties, sputtering a barrier layer of $AlO_x$ onto the top surface of a plasma sensitive device, and/or sputtering a barrier layer of $AlO_x$ on a vacuum deposited, acrylate based polymeric layer. The damage observed when depositing a barrier layer onto a previously deposited decoupling layer is distinct, and is the subject of co-pending application Ser. No. 60/711,136 (VIT 0062 MA).

Plasma damage associated with deposition of a barrier layer, a decoupling layer, or another layer essentially has a negative impact on the electrical and/or luminescent characteristics of a device resulting from encapsulation. The effects will vary by the type of device, the manufacturer of the device, and the wavelength of the light emitted. It is important to note that plasma damage is dependent on the design of the device to be encapsulated. For example, OLEDs made by some manufacturers show little to no plasma damage while OLEDs made by other manufacturers show significant plasma damage under the same deposition conditions. This suggests that that there are features within the device that affect its sensitivity to plasma exposure.

One way to detect plasma damage is to measure the voltage needed to achieve a specified level of luminescence. Another way is to measure the intensity of the luminescence. Plasma damage results in higher voltage requirements to achieve the same level of luminescence (typically 0.2 to 0.5 V higher for an OLED), and/or lower luminescence.

Although not wishing to be bound by theory, plasma damage that is observed when a decoupling layer employing plasma, a sputtered $AlO_x$, or another layer employing plasma is formed (deposited) directly on an OLED or other sensitive device is believed to be due to an adverse interaction with one or more components of the plasma, including charged or neutral species, UV radiation, and high thermal input.

Thus, there is a need for a method of preventing the damage caused by processes utilizing plasma in the encapsulation of various devices.

SUMMARY OF THE INVENTION

The present invention meets this need by providing a method of making an encapsulated plasma sensitive device comprising: providing a plasma sensitive device adjacent to a substrate; depositing a plasma protective layer on the plasma sensitive device using a process selected from non-plasma based processes, or modified sputtering processes; and depositing at least one barrier stack adjacent to the plasma protective layer, the at least one barrier stack comprising at least one decoupling layer and at least one barrier layer, the plasma sensitive device being encapsulated between the substrate and the at least one barrier stack, wherein the decoupling layer, the barrier layer, or both are deposited using a plasma process, the encapsulated plasma sensitive device having a reduced amount of damage caused by the plasma compared to an encapsulated plasma sensitive device made without the plasma protective layer.

Another aspect of the invention is an encapsulated plasma sensitive device. The encapsulated plasma sensitive device includes a substrate; a plasma sensitive device adjacent to a substrate; a plasma protective layer on the plasma sensitive device, the plasma protective layer deposited using a process selected from non-plasma based processes, or modified sputtering processes; and at least one barrier stack adjacent to the protective layer, the at least one barrier stack comprising at least one decoupling layer and at least one barrier layer, the plasma sensitive device being encapsulated between the substrate and the at least one barrier stack, wherein the encapsulated plasma sensitive device has a reduced amount of damage caused by a plasma compared to an encapsulated plasma sensitive device made without the plasma protective layer. By "adjacent," we mean next to, but not necessarily directly next to. There can be additional layers intervening between the substrate and the barrier stacks. By "on," we mean deposited directly on the previous layer without any intervening layers.

DETAILED DESCRIPTION OF THE INVENTION

The addition of a layer to shield the underlying device from exposure to the plasma (from deposition of the barrier layer, the decoupling layer, or both) has been shown to reduce or avoid plasma damage.

One method involves the deposition of a plasma protective layer using a non-plasma based process. Suitable non-plasma based processes include both vacuum processes and atmospheric processes. Suitable vacuum processes include, but are not limited to, thermal evaporation, electron beam evaporation, chemical vapor deposition (CVD), and metalorganic chemical vapor deposition (MOCVD), catalytic chemical vapor deposition, laser thermal transfer, or evaporation or chemical vapor deposition followed by ion assisted densification. Suitable atmospheric processes include, but are not limited to, spin coating, ink jet printing, screen printing, spraying, gravure printing, offset printing, and laser thermal transfer. With atmospheric processes, the working gases should be free of $O_2$ and $H_2O$ content.

The plasma protective layer can be made of inorganic and organic materials. Suitable inorganic materials include, but are not limited to, metal halides, such as $LiF_2$, $MgF_2$, $CaF_2$, and $SiO_x$. Suitable organic materials include, but are not limited to, aluminum tris 8-8-hydroxyquinoline, phthalocyanines, naphthalocyanines, and similar polycyclic aromatics.

Another method involves depositing the plasma protective layer using a modified sputtering process. Modified sputtering processes include, but are not limited to, modified reactive sputtering processes. By changing the sputtering configuration and/or the process conditions of the sputtering, a less energetic process in terms of the impact on the receiving surface can be obtained. This expands the range of plasma protective layers to include a wider range of inorganic compounds, e.g., $AlO_x$ and $SiO_x$ based layers, which have advantages including being dielectrics and chemically inert. However, the changes impact the physical and, to a lesser degree, the chemical properties of the deposited layers. For example, the density (increased porosity), stress, and grain size can be altered. One result of this can be the loss of barrier properties, despite the demonstrated ability to shield the underlying OLED from plasma damage. For example, a layer of $AlO_x$ could be deposited under conditions that avoid plasma damage, and a second layer of $AlO_x$ could be deposited as a barrier layer when the encapsulation is designed with the barrier layer first.

Figure 1:
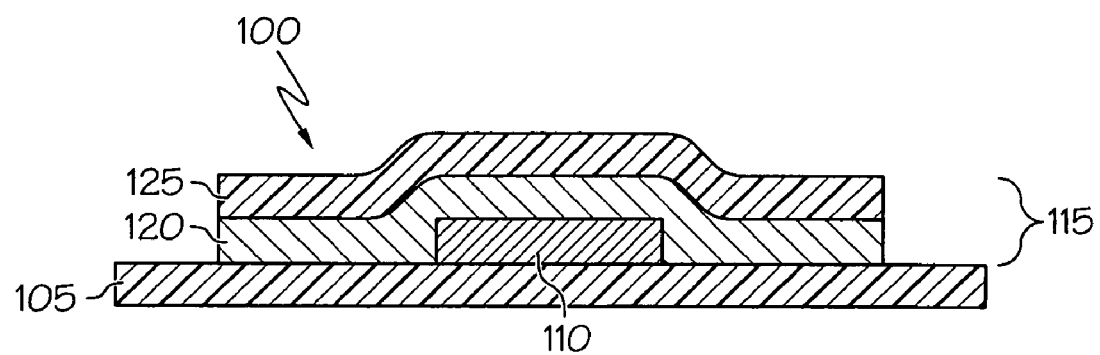
FIG. 1 is a cross-section of a portion of one embodiment of an encapsulated display device.
Figure 2:
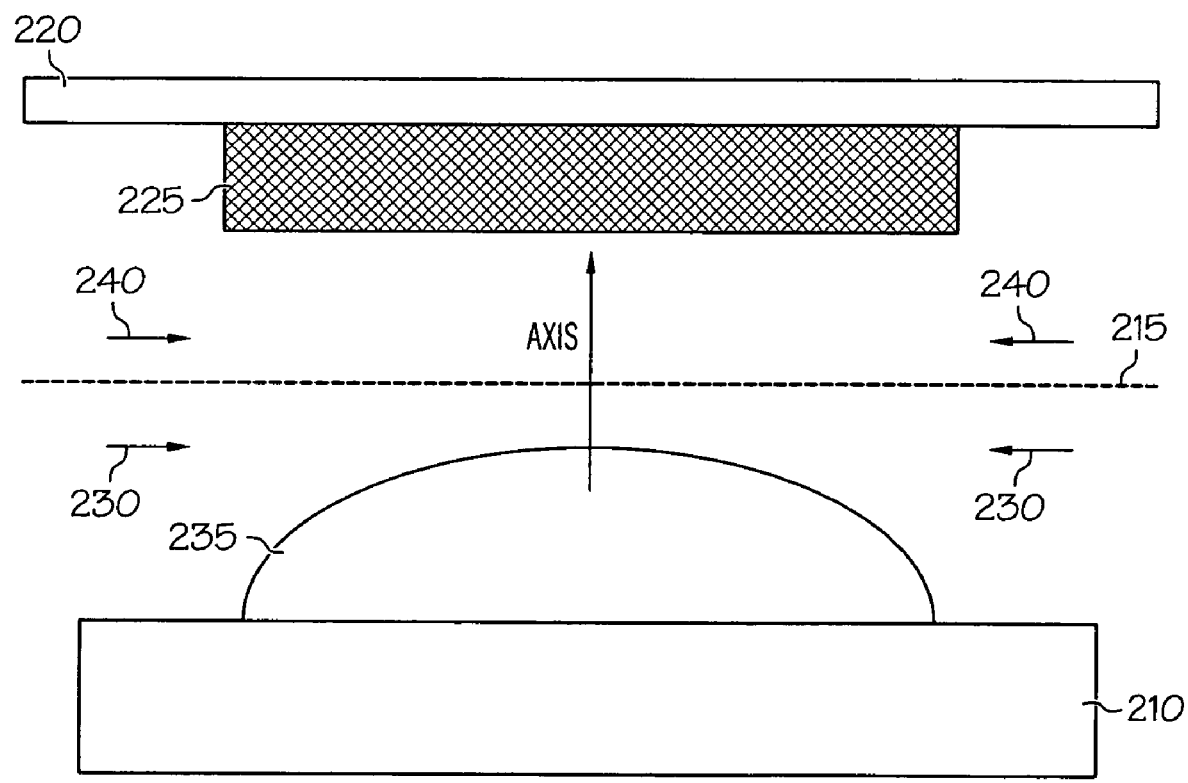
FIG. 2 is a diagram of one embodiment of a modified sputtering process according to the present invention.

One modification of the sputtering process involves the use of a screen placed between the target cathode (the source of at least a part of the material to be deposited) and the substrate with the device to be sputter coated. A diagram of this process is shown in FIG. 2. The cathode 210 is on one side of the screen 215, while the substrate 220 with the OLED 225 is on the other side. The inert sputtering gas 230 is introduced on the cathode side, and the sputtering plasma 235 is also on that side. The reactive gas 240 is fed on the substrate/device side. The presence of the screen 215 reduces the reaction of the reactive gas with the surface of the cathode 210.

Figure 3:
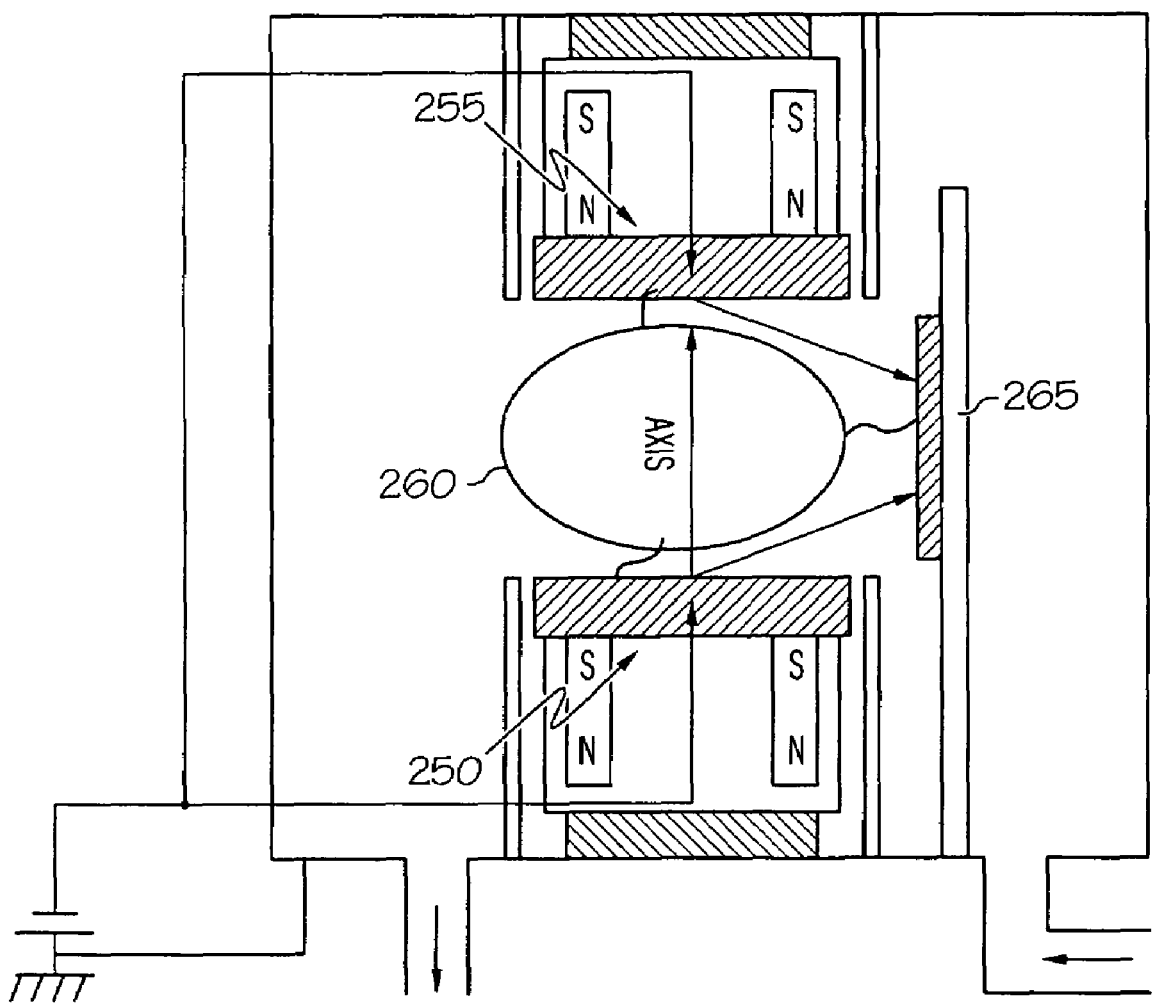
FIG. 3 is a diagram of another embodiment of a modified sputtering process according to the present invention.

Another modification of the sputtering process involves off-axis sputtering. A diagram of one embodiment of this process is shown in FIG. 3. The substrate/device receiving the sputtered material is placed at a position removed from (and oblique to) the sputtering plasma. FIG. 3 shows a "facing target" or "facing cathode" arrangement. There are two cathodes 250, 255 facing each other. The sputtering plasma 260 is positioned between the two cathodes 250, 255. The substrate/device 265 is located off to the side and perpendicular to the two cathodes 250, 255. This arrangement eliminates a direct path from the cathodes 250, 255 to the substrate/device 265. The sputtered species will reach the substrate only after multiple collisions and lose most of their energy along the way. This will reduce radical generation in the decoupling polymer layer. Another advantage of the off-axis sputtering process is the mitigation of the thermal impact of sputter deposition on thermally sensitive substrates, i.e., the indirect path of less energetic species results in less heating of receiving surfaces. There are other variations of off-axis sputtering which result in similar deposition schemes and which could be used.

Instead of changing the sputtering configuration, or in addition to it, it is also possible to vary the process parameters for the sputtering, including the exposure time or the energy/power of the plasma. Experimental results have shown that the longer the device is exposed to the plasma, the greater the plasma damage. This has led to increasing the process speed in order to reduce or eliminate the plasma damage.

Typically, for a sputtering configuration that has been determined to deposit a satisfactory barrier layer (cathode, magnet placements, spacing, gas feeds, etc.), barrier layers are deposited at a track speed of about 30 cm/min at a power of about 2000 watts. One modified process involves increasing the track speed to about 90 cm/min (about three times standard track speed) and increasing the power to 2500 watts. The increase in track speed offsets the higher power resulting in decreased overall exposure to the plasma. Alternatively, the track speed can be decreased to about 20 cm/min and the power decreased to about 500 watts. The power reduction offsets the slower speed, resulting in lower exposure to the plasma.

EXAMPLE 1

OLEDs made by two manufacturers were tested for voltage shift and light decrease. The OLEDs were supplied by the manufacturers on glass substrates. They were then encapsulated. The first layer was a thick layer (1000 Å) of $AlO_x$ followed by 4 acrylate polymer (0.5 microns)/$AlO_x$ (300 Å) pairs. The oxide layers were sputtered without a screen (Configuration I).

The results are shown in Table 1. A blue OLED made by manufacturer 1 showed a voltage shift of 0.5-0.8 V, and a moderate light decrease. A green OLED made by manufacturer 3 showed a voltage shift of 1 V, with a strong light decrease.

Voltage shift and light decrease for OLEDs encapsulated by sputtering the oxide layer with a screen were measured (Configuration II). The OLEDs were encapsulated with a first thick layer (1000 Å) of $AlO_x$ followed by either 4 or 6 acrylate polymer (0.5 microns)/$AlO_x$ (300 Å) pairs. The OLEDs were processed at the standard track speed of 30 cm/min and the standard power of 2000 watts.

The results are shown in Table 1. OLEDs from different manufacturers showed varying amounts of voltage shift and light decrease. Furthermore, different colored OLEDs from the same manufacturer showed different amounts of voltage shift and light decrease. This confirms that there is a variation in the plasma damage for OLEDs from different manufacturers, and for different colored OLEDs.

TABLE 1

|  | OLED | Configuration I | | Configuration II Standard | |
|---|---|---|---|---|---|
|  |  | Voltage Shift | Light Decrease | Voltage Shift | Light Decrease |
| Mfr 1 | blue | 0.5-0.8 | moderate | 0-0.3 | no |
| Mfr 2 | blue |  |  | 0.2 | moderate |
|  | green |  |  | 0.5 | strong |
|  | red |  |  | 0.3-0.4 | strong |
|  | red 1 |  |  |  |  |
| Mfr 3 | green | 1 | strong | 0.6 | moderate |
| Mfr 4 | green |  |  | 0.2 | no |
| Mfr 5 |  |  |  | 0.1-0.5 | no |
| Mfr 6 | green |  |  |  | 1.8 |
| Mfr 7 | yellow |  |  | 1 | strong |

EXAMPLE 2

Several encapsulated OLEDs were made with a plasma protective layer of 300 Å of LiF. The LiF was deposited using a thermal evaporation process. The OLEDs had a thick layer (1000 Å) of $AlO_x$ followed by either 4 or 6 acrylate polymer (0.5 microns)/$AlO_x$ (300 Å) pairs.

Figure 4A:
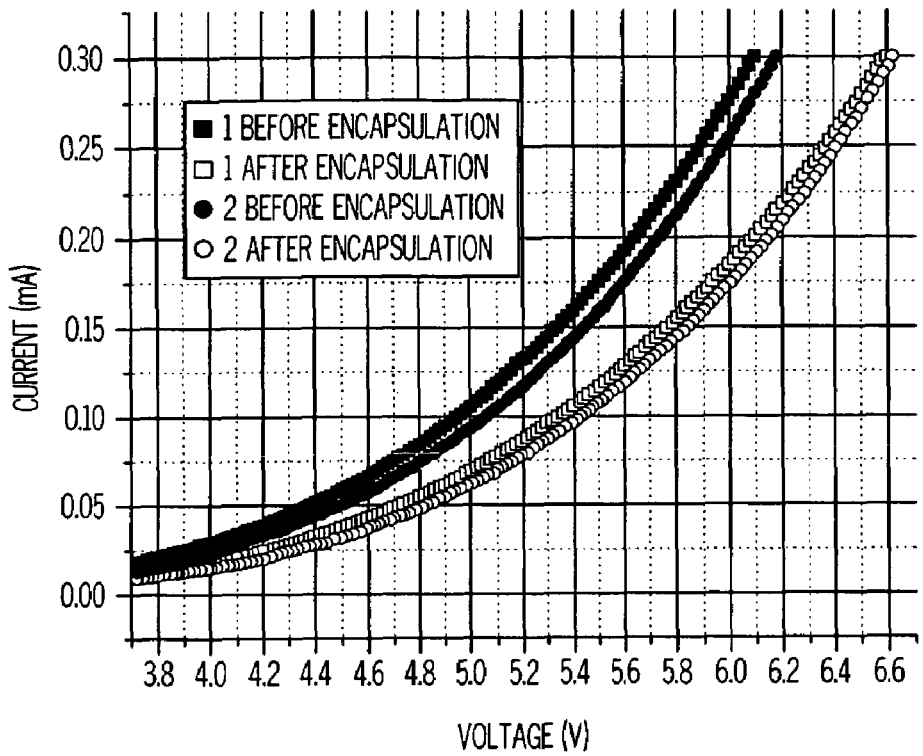
FIG. 4 are graphs showing a comparison of the voltage shift with and without a plasma protective layer.
Figure 4B:
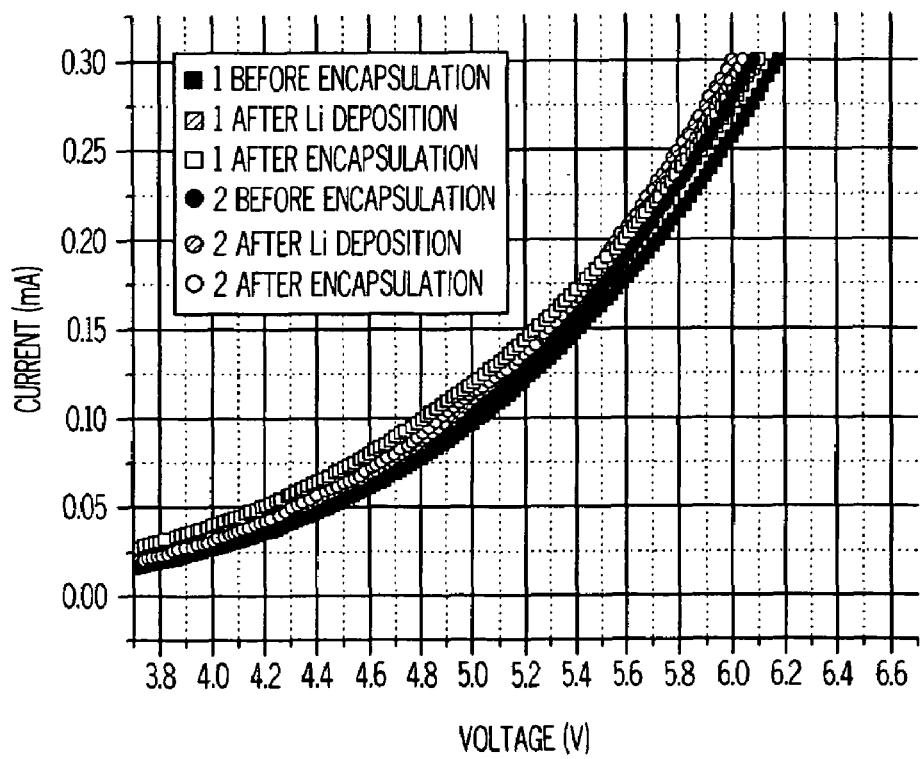
Figure 5A:
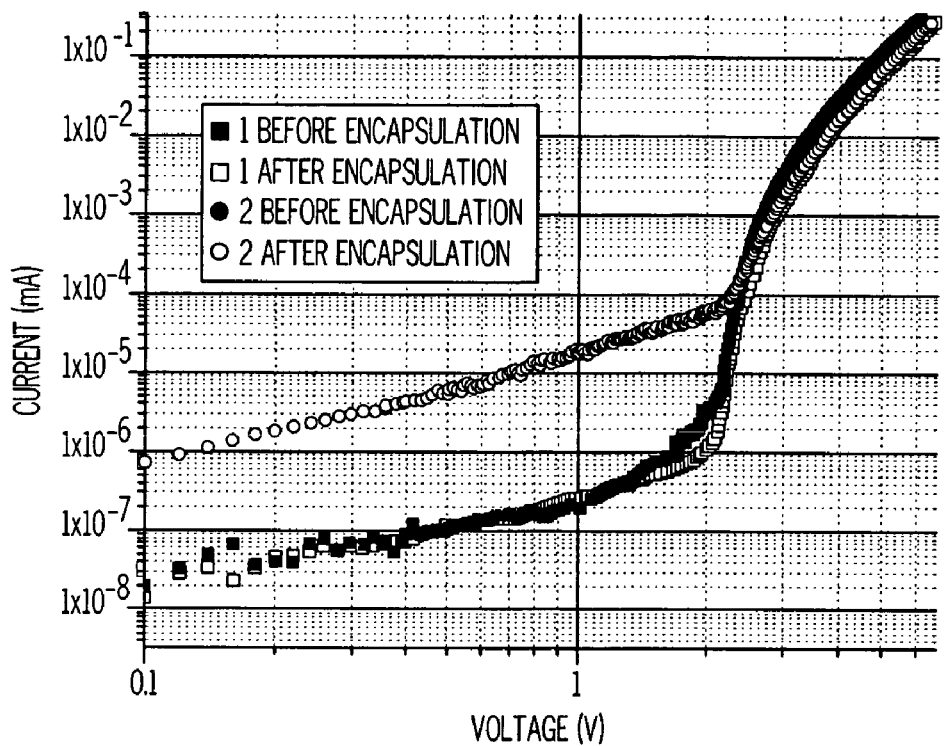
FIG. 5 are graphs showing a comparison of the leakage current with and without a plasma protective layer.
Figure 5B:
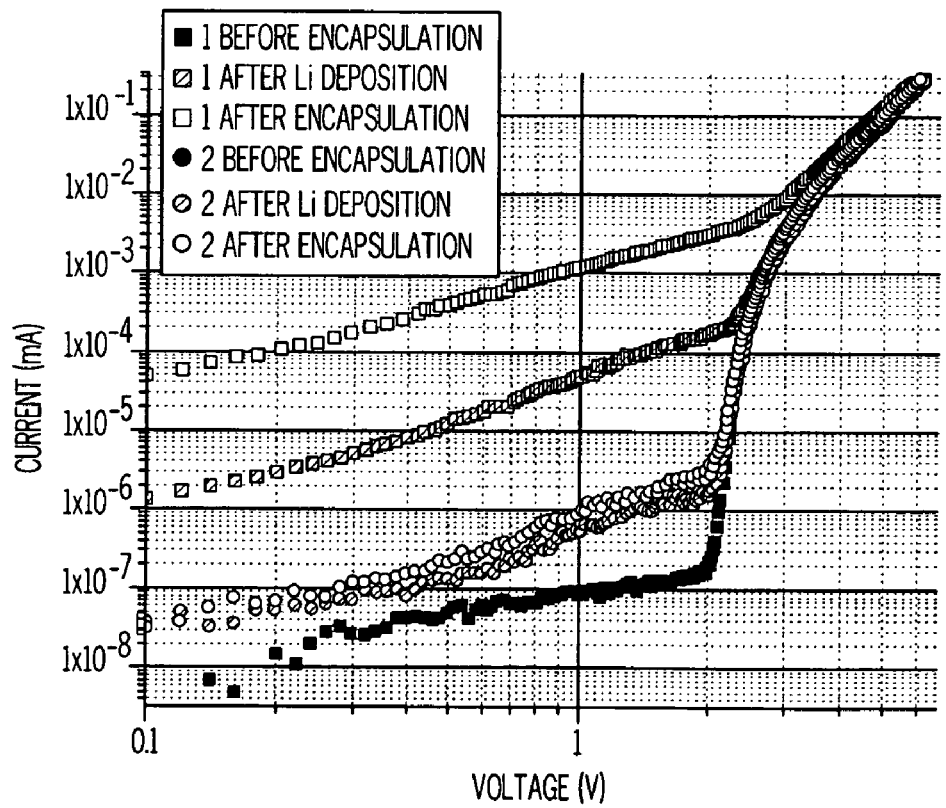
Figure 6A:
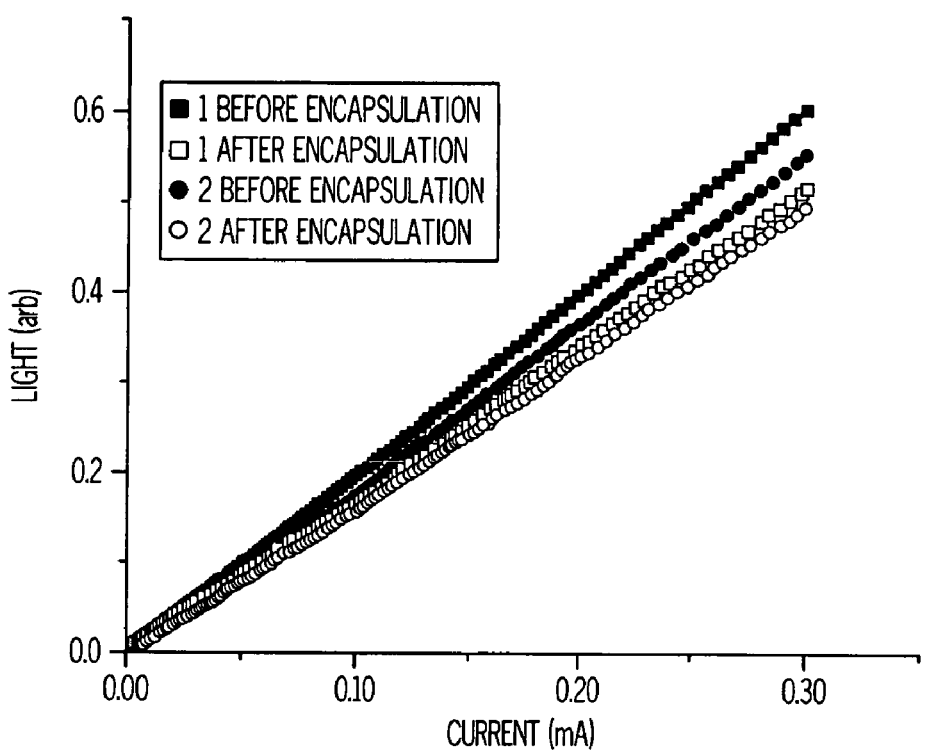
FIG. 6 are graphs showing a comparison of the light output with and without a plasma protective layer.
Figure 6B:
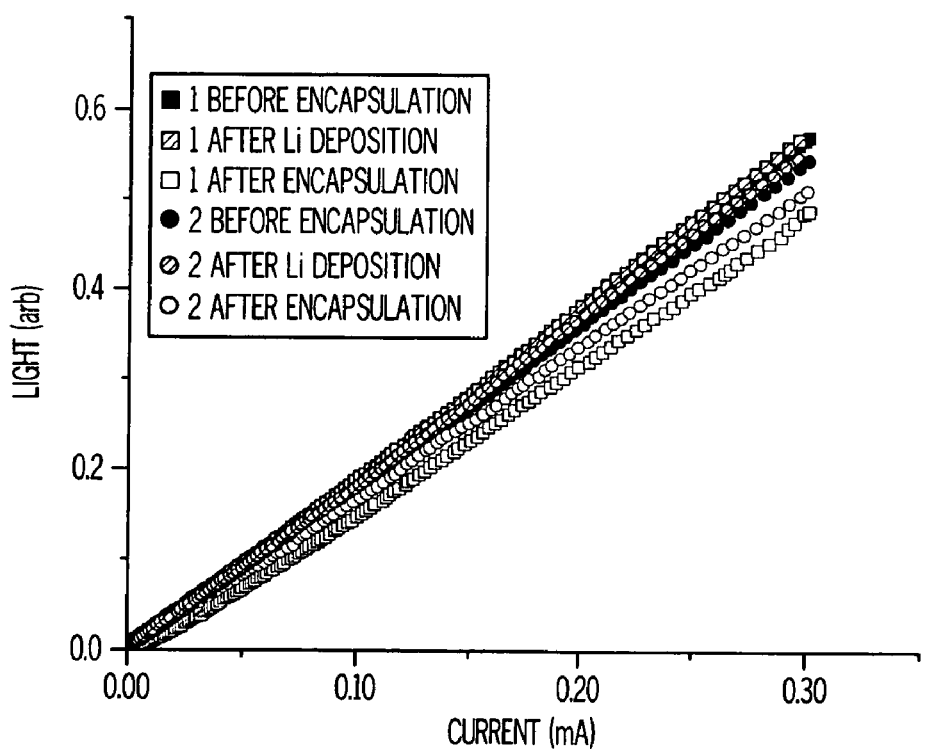

The OLEDs were tested for voltage shift, leakage current, and lightout. For comparison, several OLEDs were made without the LiF protective layer. The results are shown in FIGS. 4-6 and Table 2. The LiF protective layer eliminated the voltage shift induced by exposure to the plasma during sputtering deposition of the thick barrier layer.

Figure 7:
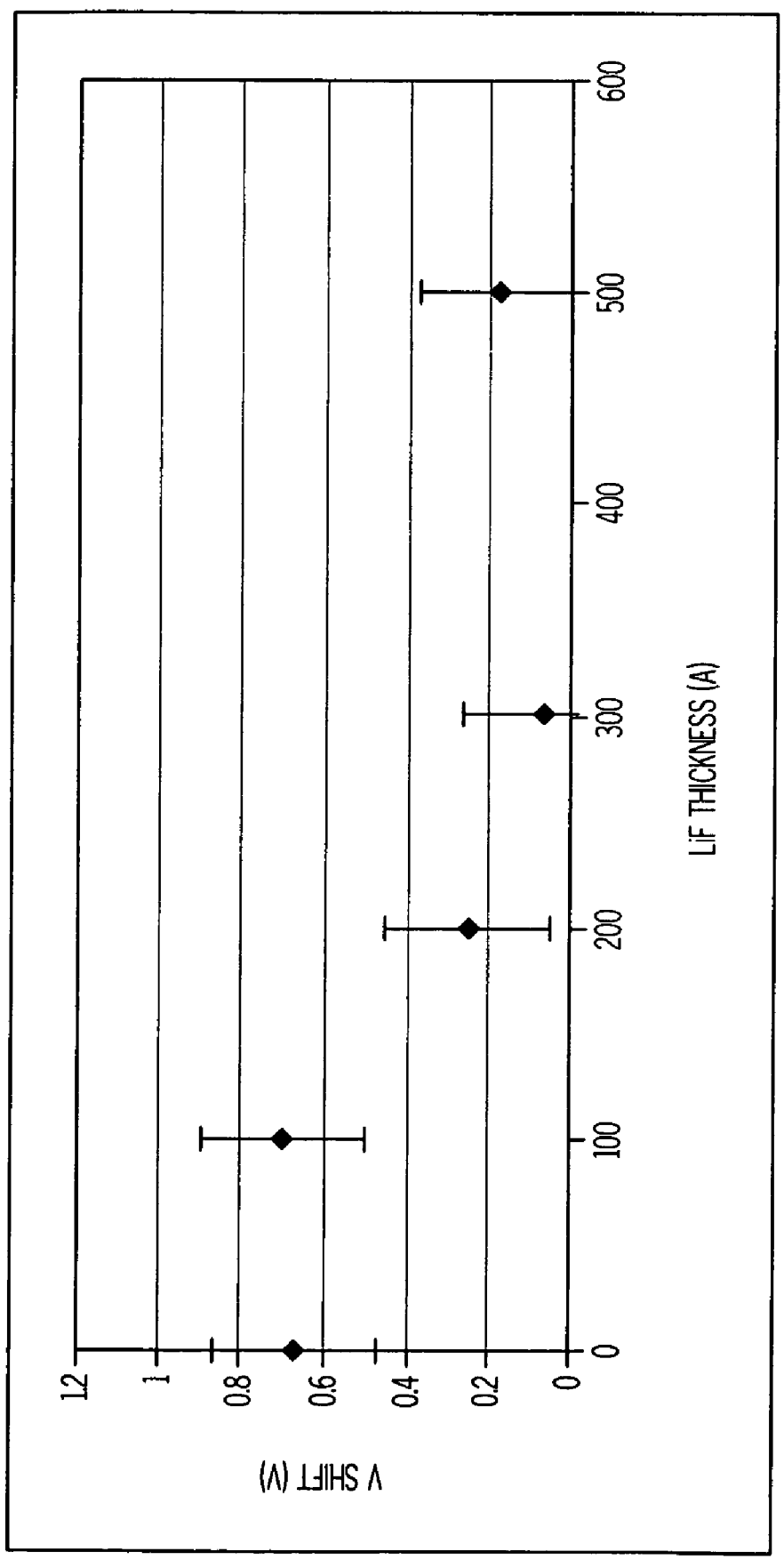
FIG. 7 is a graph showing the voltage shift as a function of the thickness of a plasma protective layer deposited using thermal evaporation.

FIG. 7 shows the voltage shift for various thicknesses of LiF. A layer of LiF was deposited on the OLEDs followed by a layer of $AlO_x$ as a barrier layer. The results suggest that a thickness of at least about 300 Å may be needed to eliminate the voltage shift.

TABLE 2

|  |  | Configuration II | | | |
|---|---|---|---|---|---|
|  |  | Standard | | LiF protection | |
|  | OLED | Voltage shift | Light Decrease | Voltage shift | Light Decrease |
| Mfr 1 | blue | 0-0.3 | no | 0 | no |
| Mfr 2 | blue | 0.2 | moderate | na | na |
|  | green | 0.5 | strong | 0 | no |
|  | red | 0.3-0.4 | strong | na | na |
|  | red 1 |  |  |  |  |
| Mfr 3 | green | 0.6 | moderate | 0.1-0.2 | no |
| Mfr 4 | green | 0.2 | no | 0 | no |
| Mfr 5 |  | 0.1-0.5 | no |  |  |
| Mfr 6 | green |  | 1.8 |  |  |
| Mfr 7 | yellow | 1 | strong | 0 | no |

EXAMPLE 3

The effect of process parameters on voltage shift was evaluated. Table 3 shows a comparison of the effect of exposure time on plasma damage. The modified conditions involved increasing the track speed to 90 cm/min (about three time standard track speed) and increasing the power to 2500 watts, and decreasing track speed to 20 cm/min and the power to 500 watts. The voltage shift and light decrease of the OLEDs made using Configuration II and standard sputtering conditions for the barrier (power of 2000 watts, track speed of 30 cm/min) are included for comparison. The voltage shift and light decrease are reduced or eliminated when the exposure time is reduced.

Figure 8:
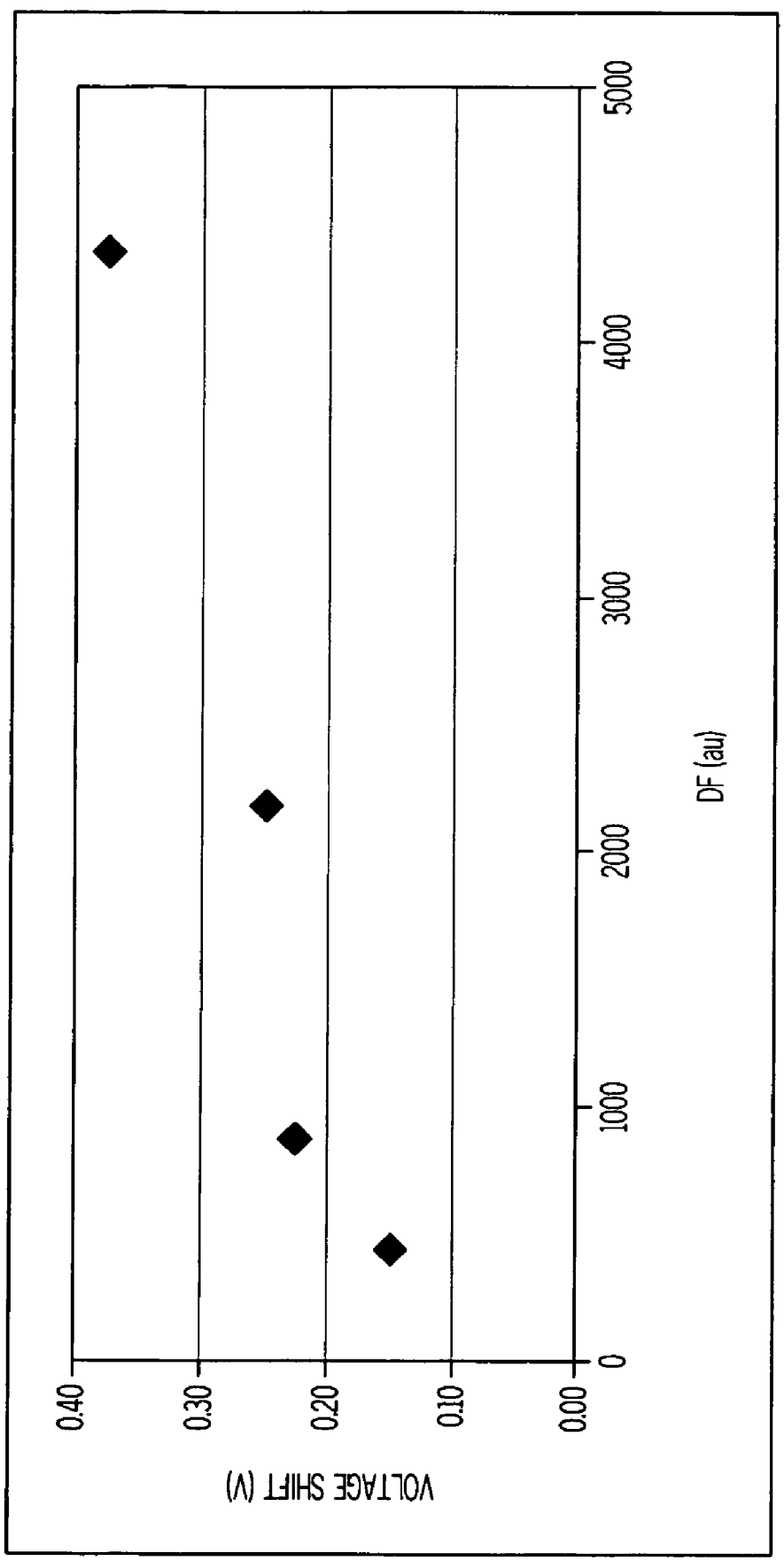
FIG. 8 is a graph showing the voltage shift as a function of DF (irradiation time x discharge power).

FIG. 8 shows the voltage shift as a function of discharge factor. Discharge factor is an approach to quantifying the exposure of a receiving surface, such as a polymer, an OLED, etc., to reactive species present in sputtering plasmas. It is related to the irradiation dose (energy/area) and is calculated by multiplying irradiation time by discharge power. Voltage shift increased with increasing discharge factor, as shown by FIG. 8. A comparable voltage shift can be obtained under different deposition conditions, e.g., power or track speed. The dominant factor is exposition time, with power having a lesser influence. This suggests that decreasing the exposition time should decrease the voltage shift.

Figure 9:
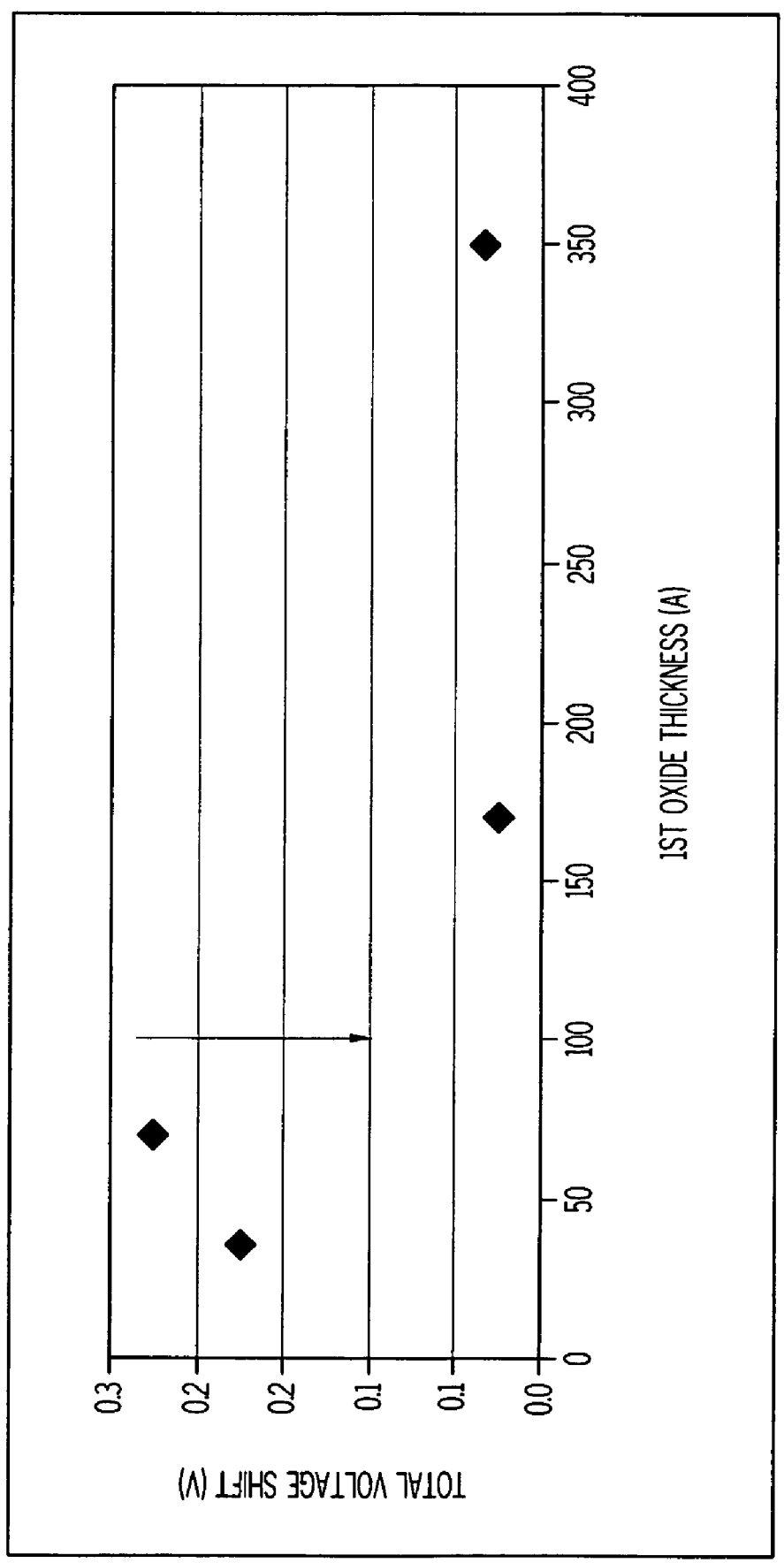
FIG. 9 is a graph showing the voltage shift as a function of the thickness of a plasma protective layer deposited using a modified sputtering process.

The voltage shift was also measured as a function of aluminum oxide protective layer thickness. By changing the process conditions (increasing the track speed to 90 cm/min (about three time standard track speed) and increasing the power to 2500 watts, and decreasing track speed to 20 cm/min and the power to 500 watts.), the thickness of the aluminum oxide protective layer was varied. As shown in FIG. 9, there is a minimum thickness of about 100 Å above which no further voltage shift is induced by the plasma process.

TABLE 3

| | | Configuration II | | |
| | | Standard | | Modified | |
| OLED | | Voltage shift | Light Decrease | Voltage shift | Light Decrease |
|---|---|---|---|---|---|
| Mfr 1 | blue | 0-0.3 | no | 0 | no |
| Mfr 2 | blue | 0.2 | moderate | 0.1 | no |
| | green | 0.5 | strong | 0.15-.35 | no |
| | red | 0.3-0.4 | strong | 0.1/0.4* | no |
| | red 1 | | | 0.1-0.3 | no |
| Mfr 3 | green | 0.6 | moderate | | |
| Mfr 4 | green | 0.2 | no | | |
| Mfr 5 | | 0.1-0.5 | no | | |
| Mfr 6 | green | | 1.8 | no | |
| Mfr 7 | yellow | 1 | strong | | |

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of making an encapsulated plasma sensitive device comprising:
   providing a plasma sensitive device adjacent to a substrate;
   depositing a plasma protective layer on the plasma sensitive device using a process selected from non-plasma based processes; and
   depositing at least one barrier stack adjacent to the plasma protective layer, the at least one barrier stack comprising at least one decoupling layer and at least one barrier layer, the plasma sensitive device being encapsulated between the substrate and the at least one barrier stack, wherein the decoupling layer, the barrier layer, or both are deposited using a plasma process, the encapsulated plasma sensitive device having a reduced amount of damage caused by a plasma compared to an encapsulated plasma sensitive device made without the plasma protective layer.

2. The method of claim 1 wherein the non-plasma based process is a process performed under a vacuum.

3. The method of claim 1 wherein the non-plasma based process is selected from thermal evaporation, electron beam evaporation, chemical vapor deposition, metalorganic chemical vapor deposition, catalytic chemical vapor deposition, laser thermal transfer, evaporation or chemical vapor deposition followed by ion densification, or combinations thereof.

4. The method of claim 1, wherein the non-plasma based process is a process performed at atmospheric pressure.

5. The method of claim 1 wherein the non-plasma based process is selected from spin coating, ink jet printing, screen printing, spraying, gravure printing, offset printing, laser thermal transfer, or combinations thereof.

6. The method of claim 1 wherein the plasma protective layer is an inorganic coating.

7. The method of claim 6 wherein the inorganic coating is selected from LiF, $MgF_2$, $CaF_2$, or combinations thereof.

8. The method of claim 1 wherein the plasma protective layer is an organic coating.

9. The method of claim 8 wherein the organic coating is selected from aluminum tris 8-hydroxyquinoline, phthalocyanines, naphthalocyanines, polycyclic aromatics, or combinations thereof.

10. The product produced by the method of claim 1.

11. A method of making an encapsulated plasma sensitive device comprising:
   providing a plasma sensitive device adjacent to a substrate;
   depositing a plasma protective layer on the plasma sensitive device using a modified sputtering process selected from providing a screen between a target cathode and the plasma sensitive device, applying off-axis sputtering, reducing a time of exposure of the plasma sensitive device to a plasma, reducing the energy of a plasma, or combinations thereof; and
   depositing at least one barrier stack adjacent to the plasma protective layer, the at least one barrier stack comprising at least one decoupling layer and at least one barrier layer, the plasma sensitive device being encapsulated between the substrate and the at least one barrier stack, wherein the decoupling layer, the barrier layer, or both are deposited using a plasma process, the encapsulated plasma sensitive device having a reduced amount of damage caused by a plasma compared to an encapsulated plasma sensitive device made without the plasma protective layer.

12. The method of claim 11 wherein the plasma protective layer is selected from $AlO_x$, $SiO_x$, or combinations thereof.

13. The method of claim 11 wherein the plasma protective layer is not a baffler layer.

14. The method of claim 11 wherein the modified sputtering process comprises a modified reactive sputtering process.

15. The product produced by the method of claim 11.

16. A method of making an encapsulated plasma sensitive device comprising:
 providing a plasma sensitive device adjacent to a substrate;
 depositing a plasma protective layer on the plasma sensitive device using a process selected from non-plasma based processes, or modified sputtering processes, the plasma protective layer being made of a dielectric material; and
 depositing at least one barrier stack adjacent to the plasma protective layer, the at least one barrier stack comprising at least one decoupling layer and at least one barrier layer, the plasma sensitive device being encapsulated between the substrate and the at least one barrier stack, wherein the decoupling layer, the barrier layer, or both are deposited using a plasma process, the encapsulated plasma sensitive device having a reduced amount of damage caused by a plasma compared to an encapsulated plasma sensitive device made without the plasma protective layer.

17. The method of claim 16 wherein the plasma protective layer is deposited using a non-plasma based process selected from thermal evaporation, electron beam evaporation, chemical vapor deposition, metalorganic chemical vapor deposition, catalytic chemical vapor deposition, laser thermal transfer, evaporation or chemical vapor deposition followed by ion densification, or combinations thereof.

18. The method of claim 16 wherein the plasma protective layer is deposited using a non-plasma based process selected from spin coating, ink jet printing, screen printing, spraying, gravure printing, offset printing, laser thermal transfer, or combinations thereof.

19. The method of claim 16 wherein the plasma protective layer is an inorganic coating.

20. The method of claim 19 wherein the inorganic coating is selected from LiF, $MgF_2$, $CaF_2$, or combinations thereof.

21. The method of claim 16 wherein the plasma protective layer is an organic coating.

22. The method of claim 16 wherein the plasma protective layer is selected from $AlO_x$, $SiO_x$, or combinations thereof.

23. The method of claim 16 wherein the plasma protective layer is not a baffier layer.

24. The method of claim 16 wherein the plasma protective layer is deposited using a modified sputtering process.

25. The method of claim 24 wherein the modified sputtering process is selected from providing a screen between a target cathode and the plasma sensitive device, applying off-axis sputtering, reducing a time of exposure of the plasma sensitive device to a plasma, reducing the energy of a plasma, or combinations thereof.

26. The method of claim 24 wherein the modified sputtering process comprises a modified reactive sputtering process.

* * * * *

UNITED STATES PATENT AND TRADEMARK OFFICE
CERTIFICATE OF CORRECTION

| | | |
|---|---|---|
| PATENT NO. | : 7,510,913 B2 | Page 1 of 1 |
| APPLICATION NO. | : 11/439474 | |
| DATED | : March 31, 2009 | |
| INVENTOR(S) | : Lorenza Moro et al. | |

It is certified that error appears in the above-identified patent and that said Letters Patent is hereby corrected as shown below:

Col. 8, line 61 "baffler" should read --barrier--

Col. 10, line 15 "baffler" should read --barrier--

Signed and Sealed this

Twenty-seventh Day of October, 2009

David J. Kappos
*Director of the United States Patent and Trademark Office*